(12) United States Patent
Seo et al.

(10) Patent No.: US 11,462,650 B2
(45) Date of Patent: Oct. 4, 2022

(54) CRYSTALLINE SILICON-BASED FLEXIBLE SOLAR CELL AND MANUFACTURING METHOD THEREFOR

(71) Applicant: UNIST(ULSAN NATIONAL INSTITUTE OF SCIENCE AND TECHNOLOGY), Ulsan (KR)

(72) Inventors: Kwan Yong Seo, Ulsan (KR); In Chan Hwang, Ulsan (KR); Han Don Um, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 290 days.

(21) Appl. No.: 16/646,511

(22) PCT Filed: Oct. 24, 2018

(86) PCT No.: PCT/KR2018/012624
§ 371 (c)(1),
(2) Date: Mar. 11, 2020

(87) PCT Pub. No.: WO2019/083269
PCT Pub. Date: May 2, 2019

(65) Prior Publication Data
US 2020/0274011 A1      Aug. 27, 2020

(30) Foreign Application Priority Data

Oct. 24, 2017   (KR) .................. 10-2017-0138452

(51) Int. Cl.
*H01L 31/0352*     (2006.01)
*H01L 31/0216*     (2014.01)
(Continued)

(52) U.S. Cl.
CPC ............ *H01L 31/035281* (2013.01); *H01L 31/02167* (2013.01); *H01L 31/022425* (2013.01);
(Continued)

(58) Field of Classification Search
None
See application file for complete search history.

(56) References Cited

U.S. PATENT DOCUMENTS

2009/0020853 A1*  1/2009  Kayes ............... H01L 21/02381
                                                              257/618
2013/0161797 A1   6/2013  Aida et al.
2016/0163887 A1   6/2016  Jeong et al.

FOREIGN PATENT DOCUMENTS

JP    2010-129965     6/2010
KR    10-1101438      1/2012
(Continued)

OTHER PUBLICATIONS

International Search Report and Written Opinion for PCT/KR2018/012624, dated Jan. 15, 2019 (w/English International Search Report).
(Continued)

*Primary Examiner* — Eli S Mekhlin
(74) *Attorney, Agent, or Firm* — Klarquist Sparkman, LLP

(57) ABSTRACT

Provided is a solar cell including: a crystalline silicon semiconductor substrate having a specific radius of curvature; a plurality of microwire structures that extend from a first surface of the crystalline silicon semiconductor substrate in a vertical direction and are arranged spaced apart from each other; a first layer positioned on the first surface of the crystalline silicon semiconductor substrate and forming a P-N junction with the crystalline silicon semiconductor substrate; a first electrode part positioned on the first layer and connected to the first layer; a second layer positioned on
(Continued)

a second surface of the crystalline silicon semiconductor substrate which is opposite the first surface; and a second electrode part positioned on the second layer and connected with the second layer.

20 Claims, 13 Drawing Sheets

(51) Int. Cl.
    *H01L 31/0224* (2006.01)
    *H01L 31/0392* (2006.01)
    *H01L 31/068* (2012.01)
    *H01L 31/18* (2006.01)

(52) U.S. Cl.
    CPC ...... *H01L 31/03926* (2013.01); *H01L 31/068* (2013.01); *H01L 31/1804* (2013.01); *H01L 31/1868* (2013.01)

(56) References Cited

FOREIGN PATENT DOCUMENTS

| KR | 10-2015-0014058 | 2/2015 |
| KR | 10-1491528 | 2/2015 |
| KR | 10-1669947 | 10/2016 |

OTHER PUBLICATIONS

Notice of Allowance for Korean Application No. 10-2017-0138452, dated Jan. 8, 2019 (w/English translation).

Office Action for Korean Application No. 10-2017-0138452, dated Jul. 24, 2018 (w/English translation).

* cited by examiner

CRYSTALLINE SILICON-BASED FLEXIBLE SOLAR CELL AND MANUFACTURING METHOD THEREFOR

CROSS REFERENCE TO RELATED APPLICATIONS

This is the U.S. National Stage of International Application No. PCT/KR2018/012624, filed Oct. 24, 2018, which in turn claims the benefit of Korean Patent Application No. 10-2017-0138452, filed Oct. 24, 2017, which applications are incorporated herein in their entireties.

TECHNICAL FIELD

The present disclosure relates to a crystalline silicon-based flexible solar cell, and a method of manufacturing the same.

BACKGROUND ART

With recent environmental problems and predicted depletion of fossil fuels, there is a growing interest in alternative energy to replace fossil fuels. Among them, solar cells have no environmental pollution problems, and have attracted attention as energy generators that directly convert natural solar energy into electrical energy using semiconductor devices.

The solar cell operates based on a P-N junction which is formed by a p-type semiconductor layer and an n-type semiconductor layer in contact with each other. The P-N junction forms an internal potential difference which allows electrical current to flow only in one direction. When a solar cell absorbs solar light, holes move from the n-type semiconductor layer to the p-type semiconductor layer, whereas electrons move from the p-type semiconductor layer to the n-type semiconductor layer, leading to current flow.

Meanwhile, recent studies have been actively conducted on flexible solar cells that may be used in various environments regardless of installation sites, such as exterior walls of buildings, finishing materials, mobile devices, windows or sunroofs of vehicles, etc. The types of flexible solar cells reported until now include organic solar cells, perovskite solar cells, dye-sensitized solar cells, thin-film solar cells using CdTe or CIGS, amorphous silicon-based solar cells, etc.

However, flexible solar cells reported until now have problems of low efficiency (e.g., dye-sensitized solar cells, amorphous silicon-based solar cells, organic solar cells), short lifespan (e.g., organic solar cells, perovskite solar cells, dye-sensitized solar cells), use of toxic materials (e.g., CdTe-based thin-film solar cells, perovskite solar cells), and high production costs (CIGS-based solar cells), as compared with commercially available crystalline silicon-based solar cells.

Accordingly, there is a demand for a flexible solar cell having flexibility while having efficiency equivalent to or more improved than the existing crystalline silicon-based solar cells, and a method of manufacturing the same.

DESCRIPTION OF EMBODIMENTS

Technical Problem

An aspect provides a flexible solar cell having flexibility while having high efficiency, as compared with existing crystalline silicon-based solar cells.

Another aspect provides a method of manufacturing the flexible solar cell.

Solution to Problem

One embodiment of the present disclosure discloses a solar cell including:

a crystalline silicon semiconductor substrate having a radius of curvature calculated by the following Equation 1;

a plurality of microwire structures that extend from a first surface of the crystalline silicon semiconductor substrate in a vertical direction and are arranged spaced apart from each other;

a first layer positioned on the first surface of the crystalline silicon semiconductor substrate and forming a P-N junction with the crystalline silicon semiconductor substrate;

a first electrode part positioned on the first layer and connected to the first layer;

a second layer positioned on a second surface of the crystalline silicon semiconductor substrate that is opposite the first surface; and a second electrode part positioned on the second layer and connected to the second layer, wherein a distance between the plurality of microwire structures is determined by the following Equation 2, and a diameter of the microwire structures is determined by the following Equations 3 to 5:

$$\rho = E \times T_s / \sigma \qquad \text{<Equation 1>}$$

($\rho$: the radius of curvature; E: an elastic modulus; $T_s$: a thickness of the crystalline silicon semiconductor substrate/2; $\sigma$: a tensile strength of the crystalline silicon semiconductor substrate)

$$S > 2 \times t \qquad \text{<Equation 2>}$$

(S: a distance between microwire structures; t: a distance of stress measured at the substrate surface where the microwire structures meet the crystalline silicon semiconductor substrate during bending of the crystalline silicon semiconductor substrate)

$$D_{wire} > 2(T_1 + T_2) \qquad \text{<Equation 3>}$$

($D_{wire}$: the diameter of the microwire; $T_1$: a thickness of an emitter layer; and $T_2$: a thickness of a depletion layer)

$$w = \sqrt{\frac{2\varepsilon}{q} v_0 \left( \frac{1}{N_A} + \frac{1}{N_D} \right)} \qquad \text{<Equation 4>}$$

(w: the thickness of a depletion layer, $\varepsilon$: a dielectric constant of crystalline silicon, q: an electric charge (coulomb), $v_O$: a built-in-voltage, $N_A$: a density of the emitter layer, and $N_D$: a density of the crystalline silicon substrate)

$$v_0 = \frac{KT}{q} \ln \left( \frac{N_A N_D}{N_i} \right) \qquad \text{<Equation 5>}$$

($v_O$: the built-in-voltage, K: Boltzmann's constant (eV/K), T: an absolute temperature (K), q: the electric charge (coulomb), $N_A$: the density of the emitter layer, $N_D$: the density of the crystalline silicon substrate, and $N_i$: a density of an intrinsic silicon substrate).

In this embodiment, the thickness of the crystalline silicon semiconductor substrate may be less than 150 μm.

In this embodiment, the thickness of the crystalline silicon semiconductor substrate may be 50 μm or less.

In this embodiment, the thickness of the crystalline silicon semiconductor substrate may be 50 μm or less, and a length of the microwire may be 30 μm.

In this embodiment, the radius of curvature of the crystalline silicon semiconductor substrate may be 15 mm or less.

In this embodiment, the crystalline silicon semiconductor substrate may have a first conductivity type, the first layer may be an emitter layer doped with an impurity having a second conductivity type opposite to the first conductivity type, and the second layer may be a back surface field layer doped with an impurity having the first conductivity type.

In this embodiment, the microwires may have a cylindrical shape or a tapered shape.

In this embodiment, the plurality of microwires may be arranged in a grid pattern.

In this embodiment, a thickness of the first layer may be 300 nm to 400 nm.

In this embodiment, the microwire may further include a passivation layer on the first layer and the second layer.

In this embodiment, the passivation layer may include silicon nitride, silicon oxide, $TiO_2$, $Al_2O_3$, or a combination thereof.

In this embodiment, a distance between the microwire structures may be 1 μm or more.

In this embodiment, a diameter of the microwire structures may be 2 μm or more.

Another embodiment of the present disclosure discloses a method of manufacturing a solar cell, the method including:

(a) forming microwire structures on a crystalline silicon semiconductor substrate having a radius of curvature calculated by the following Equation 1;

(b) forming a first layer and a second layer on a first surface and a second surface of the crystalline silicon semiconductor substrate, respectively;

(c) forming a first electrode part positioned on the first layer and connected to the first layer; and (d) forming a second electrode part positioned on the second layer and connected to the second layer, Wherein a distance between the plurality of microwire structures is determined by Equation 2 and a diameter of the microwire structures is determined by Equations 3 to 5.

In this embodiment, the forming of microwire structures may include etching the crystalline silicon substrate.

In this embodiment, the crystalline silicon semiconductor substrate may have a first conductivity type, the first layer may be formed by doping the crystalline silicon semiconductor substrate with an impurity having a second conductivity type opposite to the first conductivity type, and the second layer may be formed by doping the crystalline silicon semiconductor substrate with an impurity having the first conductivity type.

In this embodiment, the crystalline silicon substrate and the emitter layer may form a P-N junction.

In this embodiment, the method may further include, after (b), forming a passivation layer on the first layer, on the second layer, or on the first layer and the second layer, respectively.

In this embodiment, the method may further include, after (a), forming microwires having a tapered shape by selectively etching the microwire structures which are formed on the crystalline silicon substrate.

In this embodiment, the crystalline silicon semiconductor substrate may be an n-type semiconductor substrate, and the emitter layer may be formed by doping the crystalline silicon semiconductor substrate with a hole-transporting material.

Other aspects, features, and advantages than those described above will become apparent from the following drawings, claims, and detailed description of the present disclosure.

advantageous Effects of Disclosure

A solar cell according to an aspect may include a crystalline silicon semiconductor substrate having a specific radius of curvature; and a plurality of microwire structures that extend from the surface of the crystalline silicon semiconductor substrate, thereby configuring a solar cell with flexibility and high efficiency, as compared with a non-crystalline silicon-based flexible solar cell.

MODE OF DISCLOSURE

Figure 1:
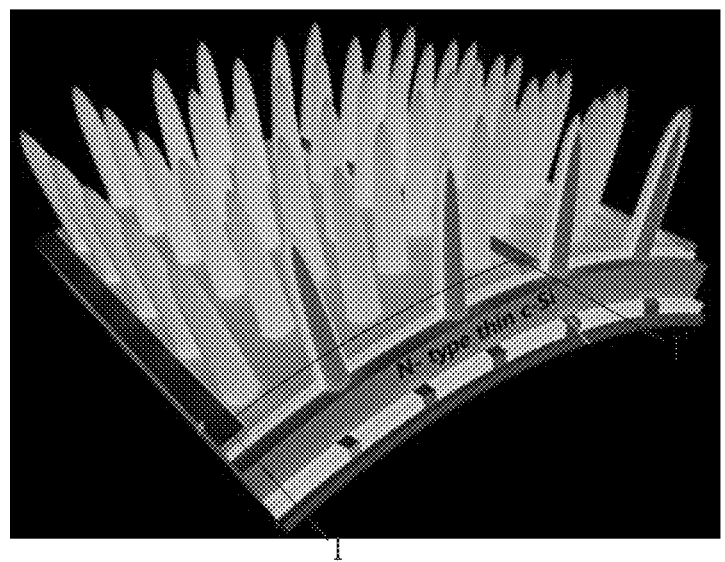
FIG. 1 is a perspective view schematically illustrating a solar cell according to one embodiment of the present disclosure.

While the present disclosure may be modified into various forms and may have a variety of embodiments, specific embodiments will be illustrated in drawings and described in detail in the detailed description. However, the description is not intended to limit the present disclosure to the particular forms disclosed, but on the contrary, the intention is to cover all modifications, equivalents, and alternatives falling within the spirit and scope of the present disclosure. In the description of the present disclosure, when a detailed description of a known related art is determined to obscure the gist of the present disclosure, the detailed description thereof will be omitted.

Although the term first, second, etc. may be used herein to describe various components, these components should not be limited by these terms. The terms are used only for distinguishing one component from another component.

The terms used herein are employed to describe only specific embodiments and are not intended to limit the present disclosure. Unless the context clearly dictates otherwise, the singular form includes the plural form. In each drawing, each element is exaggerated, omitted, or schematically illustrated for convenience in description and clarity. Also, the size of each element does not entirely reflect an actual size.

It will be understood that when an element is referred to as being "on" or "under" another element, it may be directly on/under the element or intervening elements may also be present. The expression "on" or "under" may be described, based on the drawings.

Hereinafter, embodiments of the present disclosure will be described in more detail with reference to the accompanying drawings. In the description with reference to the accompanying drawings, the same reference numerals will be given to the same or corresponding components, and a redundant description thereof will be omitted.

Figure 2:
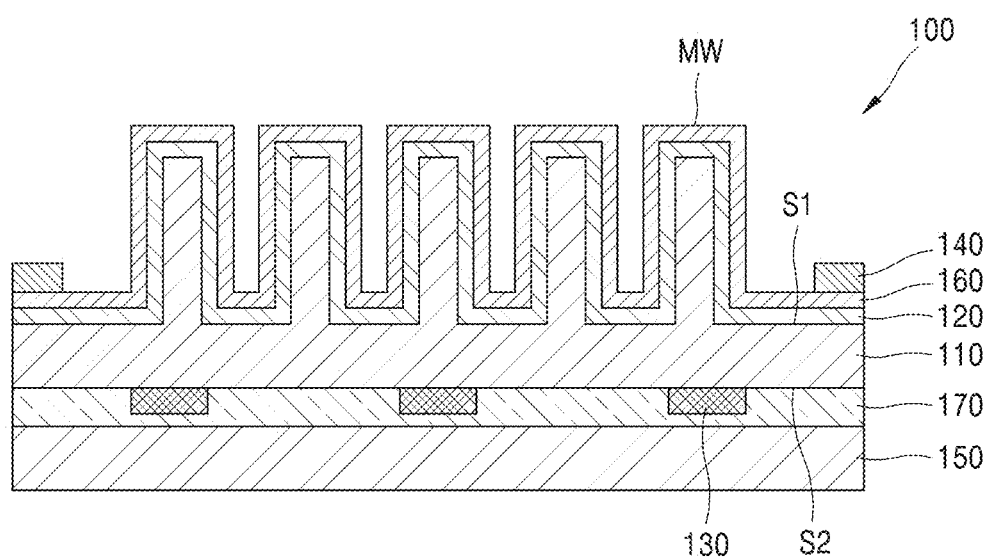
FIG. 2 is a schematic cross-sectional view taken along line I-I' of FIG. 1.

FIG. 1 is a perspective view schematically illustrating a solar cell according to one embodiment of the present disclosure. FIG. 2 is a schematic cross-sectional view taken along line I-I' of FIG. 1.

First, referring to FIGS. 1 and 2, the solar cell 100 according to one embodiment of the present disclosure may include a crystalline silicon semiconductor substrate 110; a plurality of microwire structures (MW) that extend from a first surface S1 of the crystalline silicon semiconductor substrate 110 in a vertical direction and are arranged spaced apart from each other; a first layer 120 positioned on the first surface S1 of the crystalline silicon semiconductor substrate 110 and forming a P-N junction with the crystalline silicon semiconductor substrate 110; a first electrode part 140 positioned on the first layer 120 and connected to the first layer 120; a second layer 130 positioned on a second surface S2 of the crystalline silicon semiconductor substrate that is opposite the first surface S1; and a second electrode part 150 positioned on the second layer 130 and connected to the second layer 130. Further, a passivation layer 160, 170 may be further included on the first layer 120 and the second layer 130, respectively.

The crystalline silicon semiconductor substrate 110 may be formed of a single crystalline or polycrystalline silicon, and may have a first conductivity type. In one embodiment, the crystalline silicon semiconductor substrate 110 may be doped with P, As, Sb, etc., which is a group V element, as an N-type impurity. In another embodiment, the crystalline silicon semiconductor substrate 110 may be doped with B, Ga, In, etc., which is a group III element, as a P-type impurity.

Since the microwire structures (MW) that extend from the crystalline silicon semiconductor substrate 110 in a vertical direction may have a function of a light receiving unit at a lateral side as well as at an upper side, a light absorption surface area is increased, and thus light conversion efficiency of the solar cell 100 may be improved.

The first layer 120 may form a P-N junction with the crystalline silicon semiconductor substrate 110. In one embodiment, the first layer 120 may be an emitter layer formed by doping the crystalline silicon semiconductor substrate 110 with an impurity having a second conductivity type. Therefore, the first surface S1 of the crystalline silicon semiconductor substrate 110 is not a clearly distinguished region, but may be understood as a region in which the P-N junction is formed.

For example, when the crystalline silicon semiconductor substrate 110 is doped with an N-type impurity, the first layer 120 may be doped with a P-type impurity, and on the contrary, when the crystalline silicon semiconductor substrate 110 is doped with a P-type impurity, the first layer 120 may be doped with an N-type impurity. As described, when the first layer 120, which is the emitter layer, and the crystalline silicon semiconductor substrate 110 have conductivity types opposite to each other, P-N junction is formed at an interface between the crystalline silicon semiconductor substrate 110 and the first layer 120. When light is irradiated to the P-N junction, an electromotive force may be generated through a photovoltaic effect.

In one embodiment, the second layer 130 may be a back surface field layer (BSF) formed by selectively doping the crystalline silicon semiconductor substrate 110 with an impurity having the first conductivity type. Therefore, the second surface S2 of the crystalline silicon semiconductor substrate 110 is not a clearly distinguished region, but may be understood as a region partitioning the back surface field layer (BSF) in the crystalline silicon semiconductor substrate 110.

The second layer 130 which is the back surface field layer (BSF) may prevent carriers from moving and recombining to a rear surface of the crystalline silicon substrate 110, and as a result, an open circuit voltage (Voc) of the solar cell 100 may be increased, thereby improving efficiency of the solar cell 100.

The first electrode part 140 and the second electrode part 150 collect carriers generated by light irradiation, and become a movement path through which carriers move to an external electronic device electrically connected to the solar cell 100.

The first electrode part 140 may be positioned on a light receiving surface of the solar cell 100, wherein the first electrode part 140 may have a microgrid pattern. In one embodiment, the line width of the microgrid pattern may be several μm to 1 mm, whereby the first electrode part 140 may be formed at an aperture ratio of 90% or more. Therefore, a phenomenon of obstructing incident light by the first electrode part 140 may be minimized. In contrast, the second electrode part 150 may have the same shape as the second surface S2 of the crystalline silicon semiconductor substrate 110 and may be formed on the entire bottom surface of the solar cell 100.

Meanwhile, the crystalline silicon semiconductor substrate 110 may have a radius of curvature according to the following Equation 1:

$$\rho = E \times T_s / \sigma \qquad \text{<Equation 1>}$$

in Equation 1, ρ represents the radius of curvature of the crystalline silicon semiconductor substrate, E represents an elastic modulus (here, the elastic modulus is 168 Gpa), $T_s$ represents a thickness of the crystalline silicon semiconductor substrate/2, and σ represents a tensile strength of the crystalline silicon semiconductor substrate (here, the tensile strength is 7.0 Gpa).

According to Equation 1, the radius of curvature of the crystalline silicon semiconductor substrate is proportional to the thickness of the crystalline silicon semiconductor substrate/2 ($T_s$) value. Therefore, as the crystalline silicon semiconductor substrate is thinner, the radius of curvature becomes smaller, and thus flexibility of the substrate may be improved.

In this respect, the thickness of the crystalline silicon semiconductor 110 used in the solar cell 100 according to one embodiment of the present disclosure may be less than about 150 µm. For example, the thickness of the crystalline silicon semiconductor 110 may be about 140 µm or less. For example, the thickness of the crystalline silicon semiconductor 110 may be about 130 µm or less. For example, the thickness of the crystalline silicon semiconductor 110 may be about 120 µm or less. For example, the thickness of the crystalline silicon semiconductor 110 may be about 110 µm or less. For example, the thickness of the crystalline silicon semiconductor 110 may be about 100 µm or less. For example, the thickness of the crystalline silicon semiconductor 110 may be about 90 µm or less, For example, the thickness of the crystalline silicon semiconductor 110 may be about 80 µm or less. For example, the thickness of the crystalline silicon semiconductor 110 may be more than 0 µm. For example, the thickness of the crystalline silicon semiconductor 110 may be about 10 µm or more. For example, the thickness of the crystalline silicon semiconductor 110 may be about 20 µm or more. For example, the thickness of the crystalline silicon semiconductor 110 may be about 30 µm or more. For example, the thickness of the crystalline silicon semiconductor 110 may be about 40 µm or more. For example, the thickness of the crystalline silicon semiconductor 110 may be about 50 µm or more. The thickness of the crystalline silicon semiconductor 110 may be expressed by a combination of any two numerical ranges selected from the above-described numerical ranges. For example, the thickness of the crystalline silicon semiconductor 110 may be about 50 µm or more and about less than 150 µm.

When the thickness of the crystalline silicon semiconductor substrate falls within the range, the radius of curvature of the crystalline silicon semiconductor substrate may reach a commercialization level.

Further, when the thickness of the crystalline silicon semiconductor 110 falls within the range, the radius of curvature of the crystalline silicon semiconductor substrate may be about 15 mm or less. For example, the radius of curvature of the crystalline silicon semiconductor substrate may be about 14 mm or less. For example, the radius of curvature of the crystalline silicon semiconductor substrate may be about 13 mm or less. For example, the radius of curvature of the crystalline silicon semiconductor substrate may be about 12 mm or less. For example, the radius of curvature of the crystalline silicon semiconductor substrate may be about 11 mm or less. For example, the radius of curvature of the crystalline silicon semiconductor substrate may be about mm or more. For example, the radius of curvature of the crystalline silicon semiconductor substrate may be about 2 mm or more. For example, the radius of curvature of the crystalline silicon semiconductor substrate may be about 3 mm or more. For example, the radius of curvature of the crystalline silicon semiconductor substrate may be about 4 mm or more. For example, the radius of curvature of the crystalline silicon semiconductor substrate may be about 5 mm or more. For example, the radius of curvature of the crystalline silicon semiconductor substrate may be about 6 m or more. For example, the radius of curvature of the crystalline silicon semiconductor substrate may be about 7 mm or more. For example, the radius of curvature of the crystalline silicon semiconductor substrate may be about 8 mm or more. The radius of curvature of the crystalline silicon semiconductor substrate may be expressed by a combination of any two numerical ranges selected from the above-described numerical ranges. For example, the radius of curvature of the crystalline silicon semiconductor substrate may be about 1 mm to about 15 mm.

Figure 3:
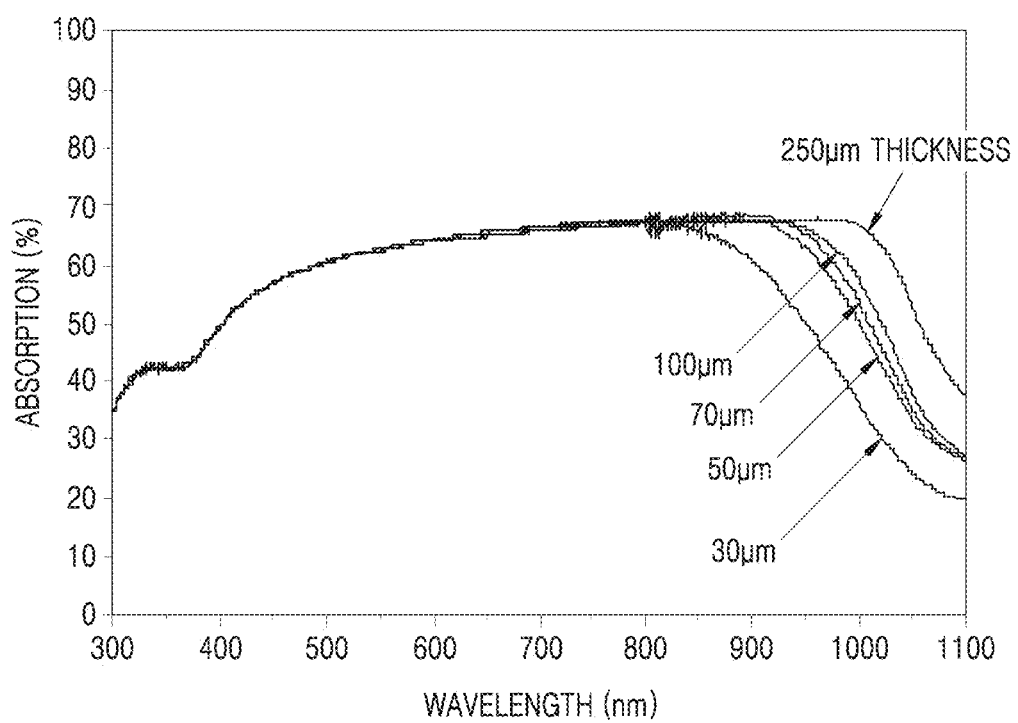
FIG. 3 is a diagram showing absorption at each wavelength according to changes in the thickness of a crystalline silicon semiconductor substrate.

FIG. 3 is a diagram showing absorption at each wavelength according to changes in the thickness of the crystalline silicon semiconductor substrate 110, wherein, even though the thickness of the crystalline silicon semiconductor substrate is reduced from 250 µm to 30 µm, light absorptions in a wavelength band of less than 800 nm are equal.

The microwire structures (MW) that extend from the first surface S1 of the crystalline silicon substrate and are arranged spaced apart from each other may be arranged spaced apart from each other by a predetermined distance, and the distance may be calculated from the following Equation 2:

$$S > 2 \times t \qquad \text{<Equation 2>}$$

in Equation 2, S represents a distance between the microwire structures, and t represents a distance of stress measured at the substrate surface where the microwire structures meet the crystalline silicon semiconductor substrate during bending of the crystalline silicon semiconductor substrate.

Figure 4:
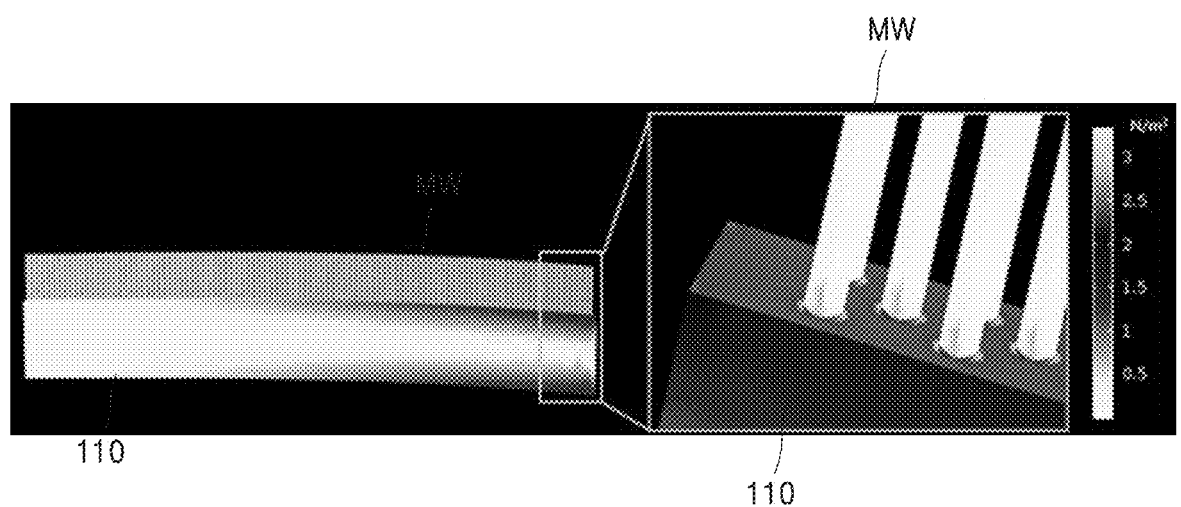
FIG. 4 is a diagram showing results of measuring stress induced at the junction of a crystalline silicon semiconductor substrate and a microwire structure during bending of the crystalline silicon semiconductor substrate.

Referring to FIG. 4, the microwire structure (MW) may induce stress at the junction of the first surface S1 of the substrate 110 and the microwire structure (MW) during bending of the silicon semiconductor substrate. Therefore, when the plurality of microwire structures are arranged closer than a predetermined distance, stresses generated during bending of the silicon semiconductor substrate may overlap and crack may occur on the first surface. Therefore, when the microwire structures are arranged to be spaced apart at a distance twice the stress distance so that stress generated in the adjacent microwire structure do not overlap, flexibility of the crystalline silicon semiconductor substrate may be secured.

For example, the distance between the microwire structures (MWs) may be 1 µm or more.

Further, as shown in FIG. 4, no stress occurs on the surface of the longitudinal direction of the microwire structure (MW), indicating that the length of the microwire structure is irrelevant to the flexibility of the crystalline silicon substrate.

The microwire structure (MW) may have a diameter of a specific value or more, and the diameter may be defined from the following Equations 3 to 5.

$$D_{wire} > 2(T_1 + T_2) \qquad \text{<Equation 3>}$$

in Equation 3, $D_{wire}$ represents a diameter of the microwire, $T_1$ represents a thickness of the first layer (here, $T_1$ is 300 nm to 400 nm), and $T_2$ represents a thickness of a depletion layer, and is calculated by the following Equations 4 and 5.

$$w = \sqrt{\frac{2\varepsilon}{q} v_0 \left( \frac{1}{N_A} + \frac{1}{N_D} \right)} \qquad \text{(Equation 4)}$$

in Equation 4, w represents a thickness of the depletion layer, ε represents a dielectric constant of crystalline silicon (here, ε is 11.9), q represents an electric charge (1.6×10⁻¹⁹ coulomb), $v_O$ represents a built-in-voltage calculated by the following Equation 5, $N_A$ represents a density of the first layer, and $N_D$ represents a density of the crystalline silicon substrate.

$$v_0 = \frac{KT}{q} \ln\left(\frac{N_A N_D}{N_i}\right) \quad \langle\text{Equation 5}\rangle$$

in Equation 5, $v_O$ represents a built-in-voltage, K represents Boltzmann's constant (8.62×10⁻⁵ eV/K), T represents an absolute temperature (here, 300 K), q represents an electric charge (1.6×10⁻¹⁹ coulomb), $N_A$ represents a density of the first layer, $N_D$ represents a density of the crystalline silicon substrate, and $N_i$ represents a density of an intrinsic silicon substrate.

Figure 5:
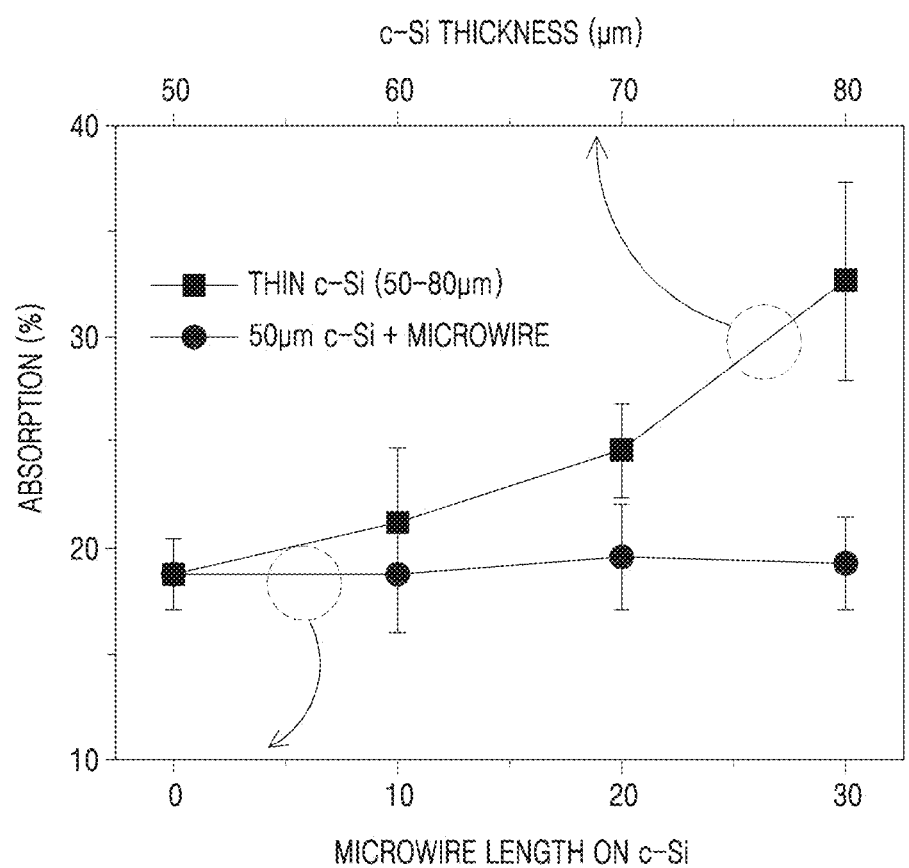
FIG. 5 is a diagram showing a comparison of changes in the radius of curvature according to the length of a microwire on a crystalline silicon semiconductor substrate having a predetermined thickness with changes in the radius of curvature according to changes in the thickness of the crystalline silicon semiconductor substrate.

FIG. 5 is a diagram showing a comparison of changes in the radius of curvature according to the length of the microwire on the crystalline silicon semiconductor substrate having a predetermined thickness with changes in the radius of curvature according to changes in the thickness of the crystalline silicon semiconductor substrate.

Referring to FIG. 5, when the crystalline silicon semiconductor substrate is maintained at a constant thickness, the radius of curvature hardly changes even when the length of microwire is changed. Thus, it may be seen that the length of the microwire is not a variable that affects the radius of curvature.

As mentioned above, the radius of curvature related to flexibility is determined by the thickness of the crystalline silicon semiconductor substrate and the separation distance between the microwires.

Figure 6:
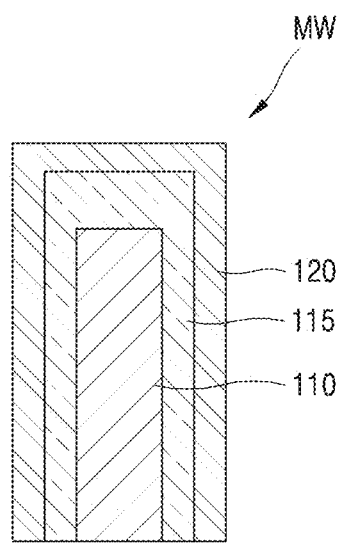
FIG. 6 is an enlarged view of a microwire structure.

Referring to FIG. 6, the microwire structure (MW) has a radial junction structure. A crystalline silicon semiconductor layer extending vertically from the crystalline silicon semiconductor substrate 110 and the first layer 120 forming a PN junction with the crystalline silicon semiconductor layer, and a depletion layer 115 between the crystalline silicon semiconductor substrate 110 and the first layer 120 may be included. In this regard, a thickness of the first layer 110 may be 300 nm to 400 nm. Within this range, the efficiency of the solar cell may be maximized.

Since the microwire structure (MW) has the radial junction structure, it may absorb light from the upper surface as well as the lateral surface. Therefore, its light absorption surface area is increased and the carrier movement path is shortened, as compared with a planar junction structure that absorbs light only from the upper surface. Accordingly, it is expected to increase the solar cell efficiency.

Referring to Equations 3 to 5, the diameter of the microwire structures (MW) is determined by the thickness of the depletion layer 115, and the thickness of the depletion layer 115 is related to the density of the first layer 120 and the density of the crystalline silicon semiconductor substrate 110.

Therefore, the diameter of the microwire structures (MW) may be determined by the thickness of the depletion layer 115, the density of the first layer 120, and the density of the crystalline silicon semiconductor substrate 110.

For example, the diameter of the microwire structures (MW) may be 2 μm or more.

The microwire structure (MW) may have a cylindrical or tapered shape. In one embodiment, when the microwire structure (MW) is configured in a cylindrical shape, the light absorption surface area may be maximized, and the carrier movement path may be shortened, thereby maximizing the light absorption efficiency, leading to improvement of the solar cell efficiency. In another embodiment, when the microwire structure (MW) is configured in a tapered shape, light reflectance on the upper surface of the microstructure is reduced, thereby increasing light absorption, leading to improvement of the solar cell efficiency.

Figure 7:
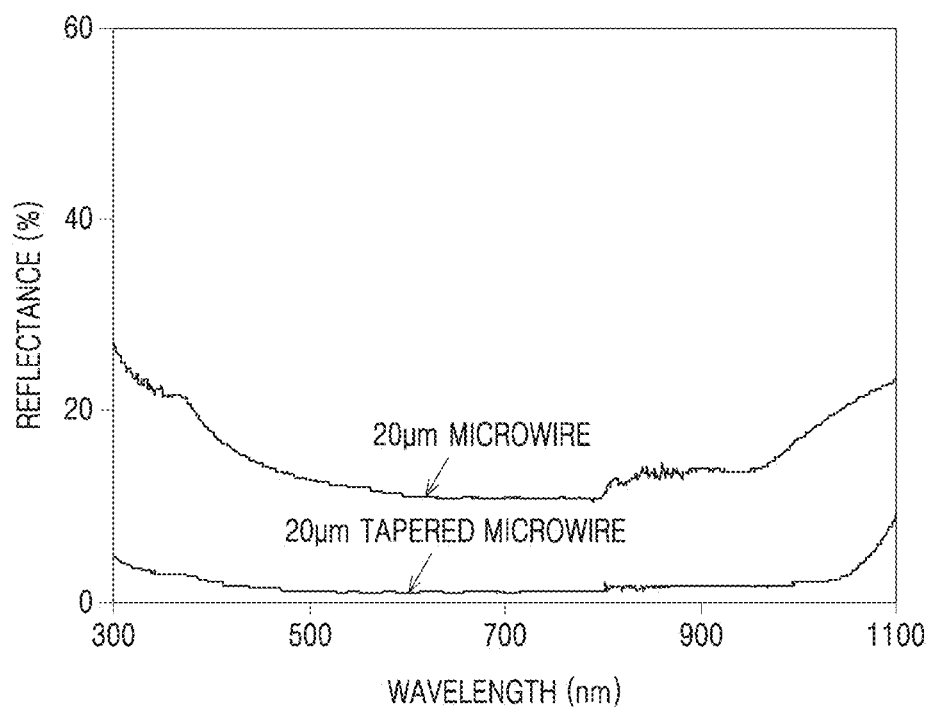
FIG. 7 is a diagram showing reflectance of a cylindrical microwire structure and a tapered microwire structure at each wavelength.

FIG. 7 is a diagram showing reflectance of the cylindrical microwire structure and the tapered microwire structure at each wavelength, wherein the tapered microwire structure shows remarkably low light reflectance, as compared with the cylindrical microwire structure.

The plurality of microwire structures may be arranged in a grid pattern, but is not limited thereto. Any pattern may be applied, as long as the microwire structures are spaced apart from each other at the above-described distance.

When the plurality of microwire structures are arranged in the grid pattern, the number of microwire structures per unit area may be maximized, thereby improving the solar cell efficiency.

Figure 8:
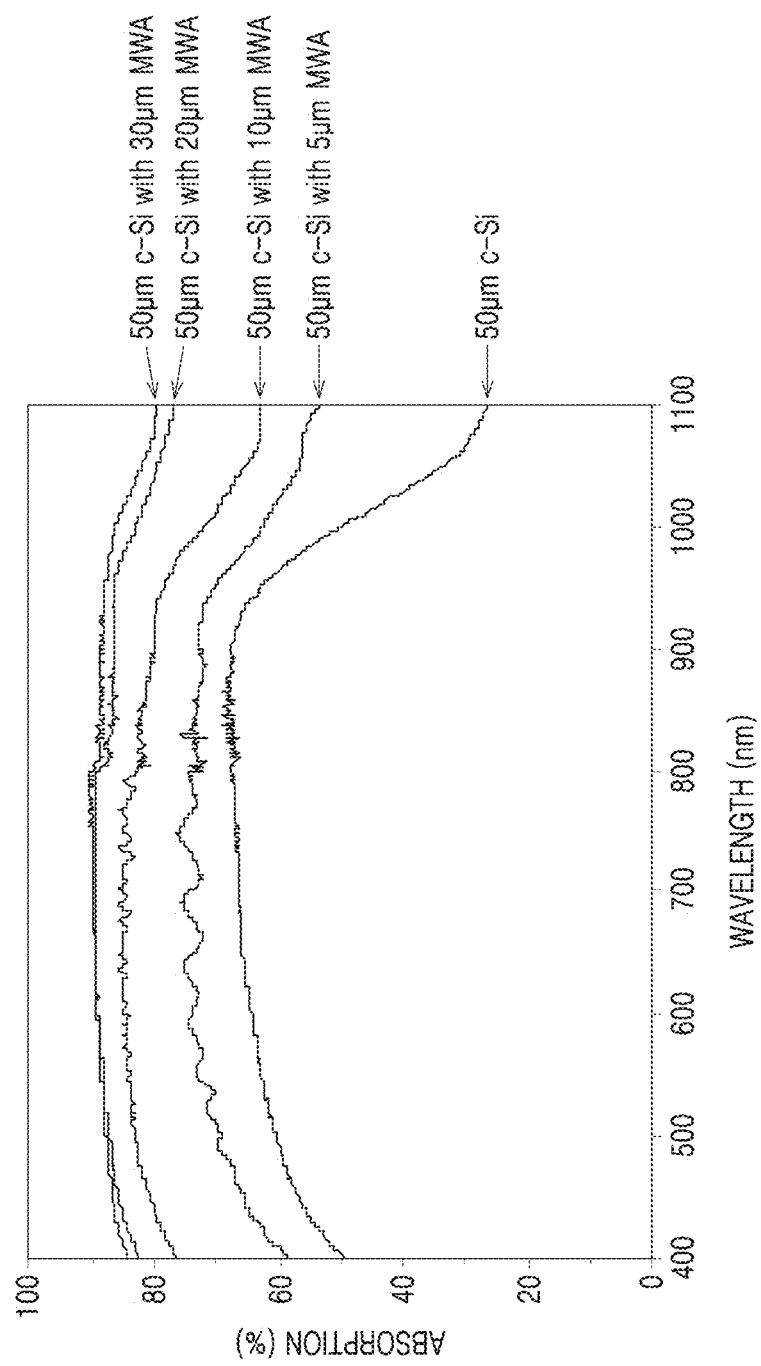
FIG. 8 is a diagram showing differences of light absorption according to the length of a microwire structure.
Figure 9:
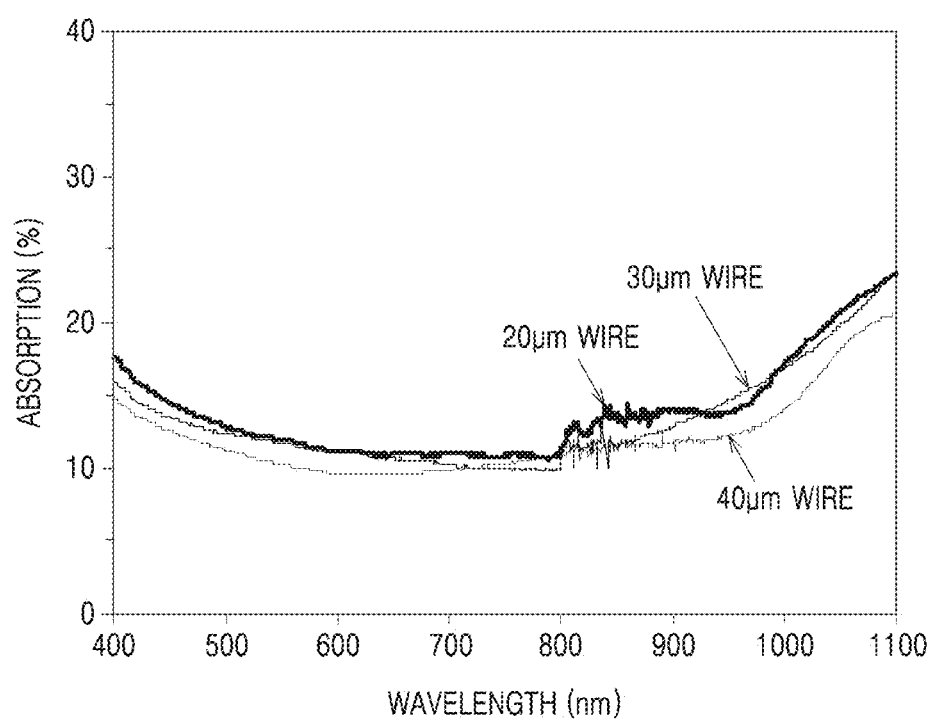
FIG. 9 is a diagram showing differences of light reflectance according to the length of a microwire structure.

FIGS. 8 and 9 are diagrams showing differences of light absorption and light reflectance according to the length of the microwire structure. As the length of the microwire structure increases, the light absorption tends to increase. However, when the length exceeds 20 μm, no change is observed in the light absorption, and the light reflectance does not depend on the length of the microwire structure.

According to FIGS. 8 and 9, to obtain the commercialization efficiency of the solar cell according to an embodiment of the present disclosure, the microwire may be configured at the length of 10 μm or more, and to obtain the maximum efficiency, the microwire may be configured at the length of 20 μm or more.

Figure 10:
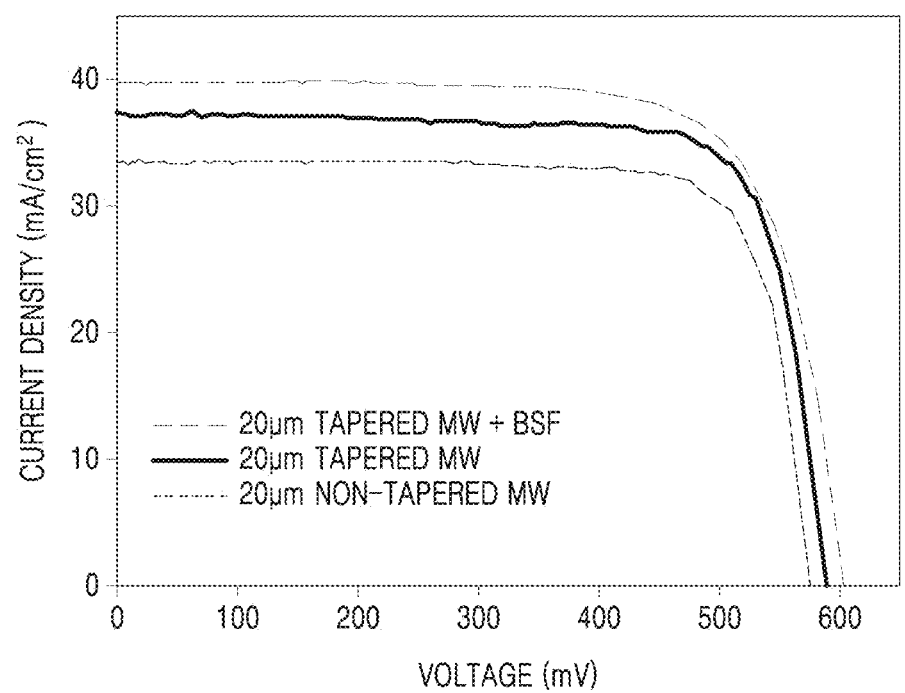
FIG. 10 is a diagram showing efficiency of (i) a full-area contact back surface field layer-based solar cell, in which a length of a cylindrical microwire structure is 20 μm, (ii) a full-area contact back surface field layer-based solar cell, in which a length of a tapered microwire structure is 20 μm, and (iii) a localized contact back surface field layer-based solar cell, in which a length of a tapered microwire structure is 20 μm.

FIG. 10 is a diagram showing efficiency of (i) a solar cell including back surface field layer, in which a length of a cylindrical microwire structure is 20 μm, (ii) a solar cell including back surface field layer, in which a length of a tapered microwire structure is 20 μm, and (iii) a solar cell including a Localized back surface field layer, in which a length of a tapered microwire structure is 20 μm.

According to FIG. 10, the solar cell employing the tapered microstructure (efficiency: 16.8%) was more efficient than the cylindrical microwire structure (efficiency: 15.2%), and the solar cell in which the localized contact back surface field layer is formed on the tapered microstructure showed the highest efficiency (18.9%).

Figure 11:
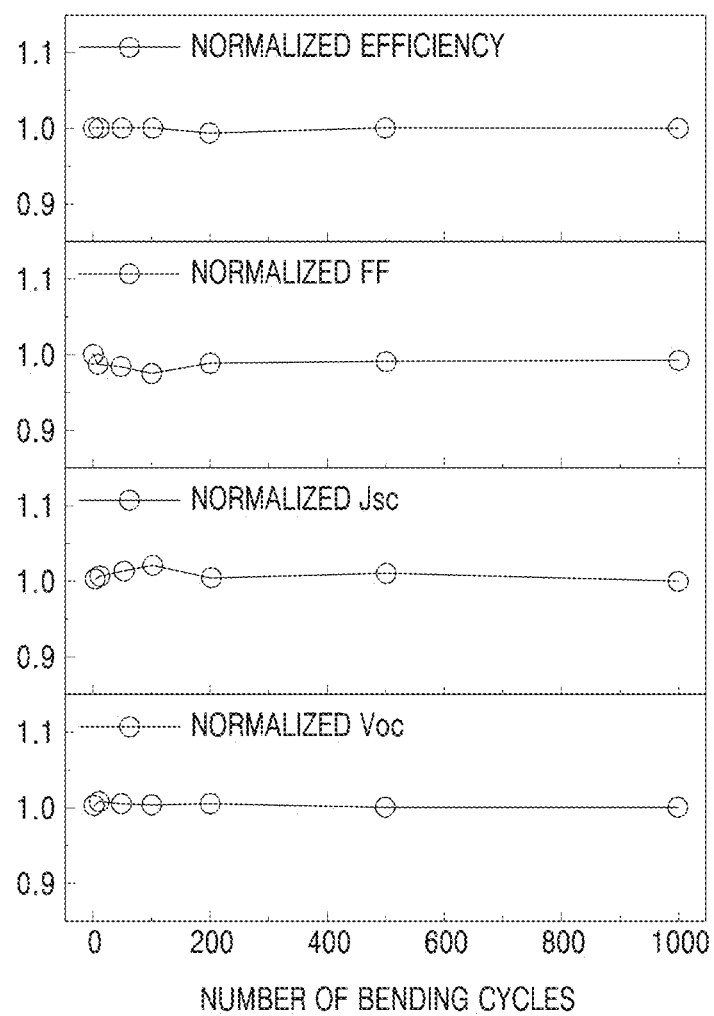
FIG. 11 shows results of a flexibility test of measuring efficiency, fill factor, Jsc, and Voc values while repeating 1000 cycles of a bending test of a solar cell according to one embodiment of the present disclosure.

FIG. 11 shows results of a flexibility test of measuring efficiency, fill factor, Jsc, and Voc values while repeating 1000 cycles of a bending test of the solar cell according to one embodiment of the present disclosure.

According to FIG. 11, all normalized efficiency, fill factor, Jsc, and Voc values are close to 1.0, indicating excellent durability of the solar cell.

Referring to FIGS. 1 and 2 again, the solar cell 100 may further include a passivation layer 160, 170 on the first layer and the second layer.

The passivation layer 160 may be formed on the light receiving surface of the crystalline silicon semiconductor substrate 110 to prevent recombination of electric charges generated by incident solar radiation. The passivation layer 160 may be formed by including a-Si, a-SiOx, or $Al_2O_3$. In particular, since a-SiOx and $Al_2O_3$ have a bandgap energy of 1.8 eV or more, a light absorption coefficient is small, and thus reduction in the amount of incident light on the crystalline silicon semiconductor substrate 110 may be prevented.

The passivation layer 170 is formed on the opposite side of the light receiving surface of the crystalline silicon semiconductor substrate 110 to provide an effect of preventing surface recombination.

The passivation layers 160, 170 may independently include a compound selected from silicon nitride, silicon oxide, $TiO_2$, $Al_2O_3$, and combinations thereof.

Figure 12:
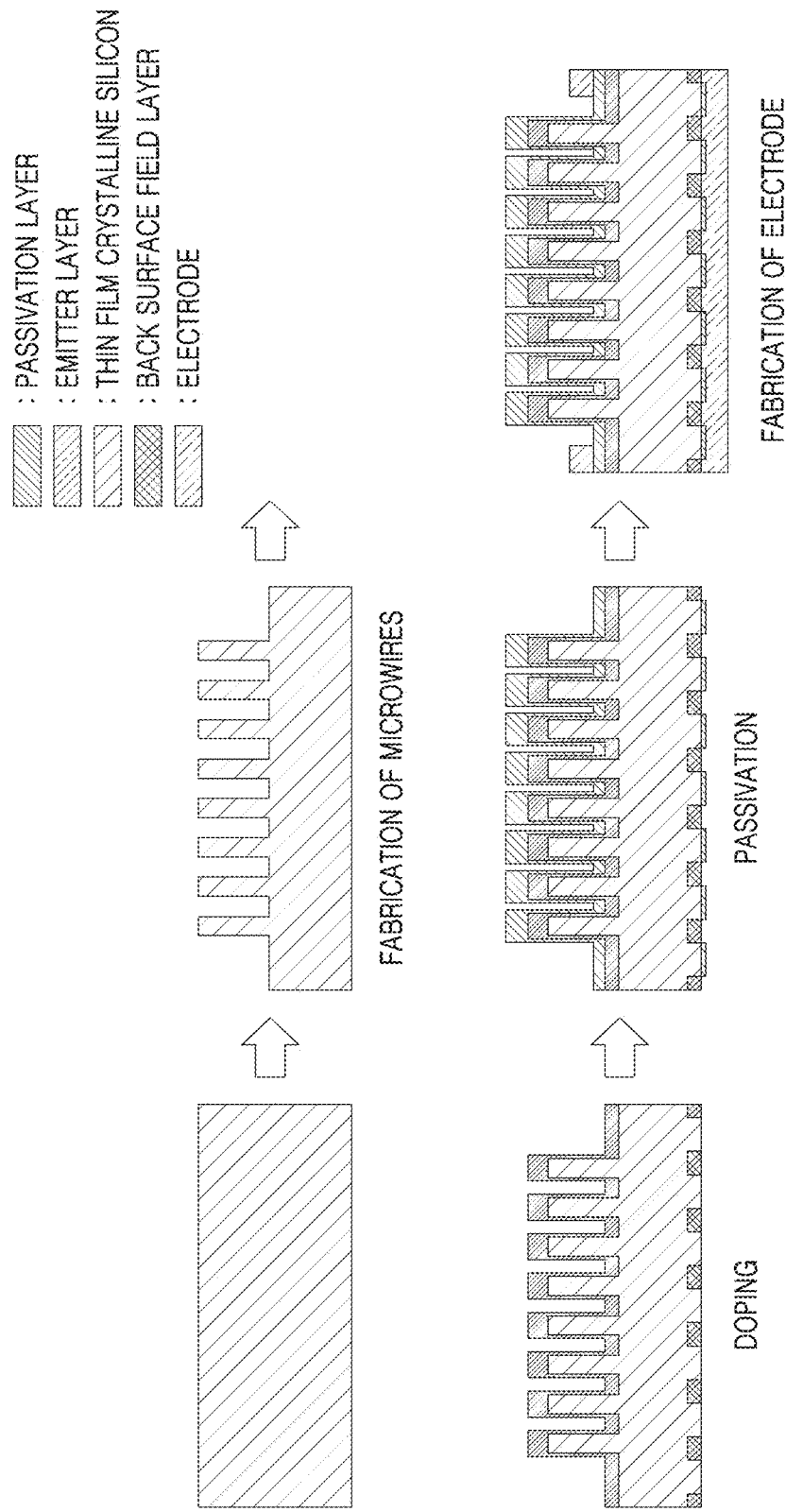
FIG. 12 is a schematic diagram illustrating a process of manufacturing a solar cell according to one embodiment.

FIG. 12 is a schematic diagram illustrating a process of manufacturing the solar cell according to one embodiment.

The method of manufacturing the solar cell 100 according to one embodiment of the present disclosure may include (a) forming the microwire structures on the crystalline silicon semiconductor substrate having the radius of curvature calculated by Equation 1; (b) forming the first layer and the second layer on the first surface and the second surface of the crystalline silicon semiconductor substrate, respectively; (c) forming the first electrode part positioned on the first layer and connected to the first layer; and (d) forming the second electrode part positioned on the second layer and connected to the second layer. Further, the method may further include, after (b), forming a passivation layer on the first layer and the second layer.

The thickness of the crystalline silicon semiconductor substrate may be 50 μm to 80 μm.

The forming of the microwire structures may include etching the crystalline silicon semiconductor substrate. The etching the crystalline silicon semiconductor substrate may be performed by a dry etching process or a wet etching process. For example, the forming of the microwire structures may be performed by the dry etching process.

The dry etching process may include forming a wire etching mask pattern on the silicon substrate through photolithography, performing a reactive ion etching process with a pressure of 45 mTorr, a source power of 1500 W, and a stage power of 100 W under gas supply of $SF_6$ and $C_4F_8$, and then removing photoresist residues through $O_2$ plasma treatment to form the microwire structures.

The wet etching process may include forming a wire etching mask pattern on the silicon substrate through photolithography, removing photoresist residues through $O_2$ plasma treatment, depositing an Au thin film on the silicon substrate by a thermal evaporator, and then performing etching treatment of the silicon substrate using a mixed solution of deionized water, HF (10 M), and $H_2O_2$ (0.3 M) to form the microwire structures.

In addition, the forming of the microwire structures may include growing the microwire structures.

The growing the microwire structures may include a process of patterning a metal catalyst such as Au, Cu, etc. on the silicon substrate through a photolithography process, and then growing the microwire structures through a gas-liquid-solid (VLS) process.

The first layer 120 may be formed by doping an impurity having a conductivity type which is opposite to the conductivity type of the crystalline silicon semiconductor substrate 110, and the second layer 130 may be formed by doping an impurity having a conductivity type which is the same as the conductivity type of the crystalline silicon semiconductor substrate 110.

The crystalline silicon semiconductor substrate and the first layer may form the P-N junction.

For example, when the crystalline silicon semiconductor substrate 110 is an N-type, the crystalline silicon semiconductor substrate may be formed by doping the crystalline silicon semiconductor substrate with an N-type impurity, the first layer 120 may be formed by doping the crystalline silicon semiconductor substrate 110 with a P-type impurity, and the second layer 130 may be formed by forming the passivation layer 170 on the crystalline silicon semiconductor substrate, locally patterning the same, and then doping the patterned region with the N-type impurity. Therefore, the first surface S1 and the second surface S2 of the crystalline silicon semiconductor substrate 110 may be a boundary appearing when the first layer 120 and the second layer 130 are formed, and they may have various shapes. A impurity-doping method of forming the first layer 120 and the second layer 130 may be performed by a diffusion method, a spraying method, a printing processing method, etc.

For another example, when the crystalline silicon semiconductor substrate 110 is the N-type, the crystalline silicon semiconductor substrate may include an electron-transporting material, the first layer 120 may be a hole-transporting layer including a hole-transporting material, and the second layer 130 may be an electron-transporting layer including an electron-transporting material.

The hole-transporting layer may include a transition metal oxide having a high work function. For example, the hole-transporting layer may include molybdenum oxide ($MoO_x$), vanadium oxide ($V_2O_x$), tungsten oxide ($WO_x$), nickel oxide ($NiO_x$), etc.

The electron-transporting layer may include an alkali metal compound having a low work function. For example, the electron-transporting layer may include lithium fluoride (LiF), cesium fluoride (CsF), cesium oxide ($Cs_2O$), calcium/aluminum (Ca/Al), etc.

The deposition of the electron-transporting material and the hole-transporting material may be performed by a method of sputtering, electron beam evaporation, chemical vapor deposition, physical vapor deposition, metal-organic chemical vapor deposition, molecular beam epitaxy, atomic layer deposition, etc.

The passivation layer 170 may be formed by a method of sputtering, e-beam evaporation, chemical vapor deposition (CVD), physical vapor deposition (PVD), metal-organic chemical vapor deposition (MOCVD), molecular beam epitaxy (MBE), atomic layer deposition, etc.

The first electrode part 140 may be, for example, formed through a heat treatment process after printing a first electrode-forming paste at a position where the first electrode part 140 is to be formed by stamping or rolling the first electrode-forming paste. Therefore, even though the first electrode part 140 has a microgrid pattern having a width of several micrometers to several tens of micrometers, alignment of the first electrode part 140 may be easily performed, and the first electrode part 140 may be connected to the first layer 120 by passing through the passivation layer 170 by a fire through phenomenon that occurs during heat treatment.

The second electrode part 150 may be, for example, formed through a heat treatment process after applying a second electrode-forming paste on the second layer 130, but is not limited thereto, and may be formed by various methods.

Figure 13:
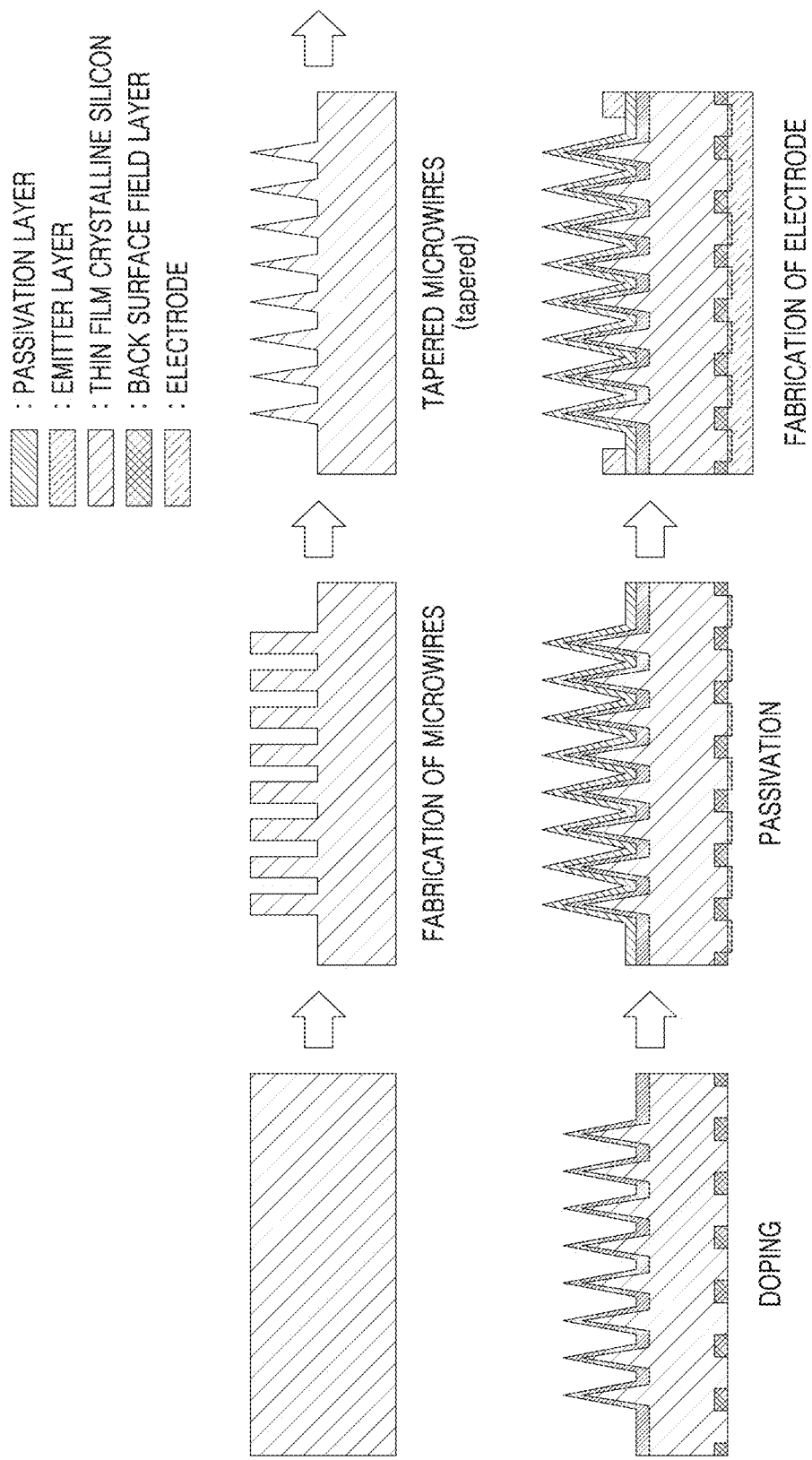
FIG. 13 is a schematic diagram illustrating a process of manufacturing a solar cell according to one embodiment.

According to another embodiment of the present disclosure according to FIG. 13, the method of manufacturing the above-described solar cell may further include, after (a), forming tapered microwires by selectively etching the microwire structures formed on the crystalline silicon semiconductor substrate.

While the present disclosure has been described with reference to the embodiments shown in the drawings, the embodiments are merely illustrative and it will be understood by those skilled in the art that various modifications and other equivalent embodiments are possible. Thus, the genuine technical scope of the present disclosure is defined by the technical spirit of the accompanying claims.

The invention claimed is:

1. A solar cell comprising:
a crystalline silicon semiconductor substrate having a minimum radius of curvature calculated by Equation 1;
a plurality of microwire structures that extend from a first surface of the crystalline silicon semiconductor substrate in a vertical direction and are arranged spaced apart from each other;
a first layer positioned on the first surface of the crystalline silicon semiconductor substrate and forming a P-N junction with the crystalline silicon semiconductor substrate;
a first electrode part positioned on the first layer and connected to the first layer;
a second layer positioned on a second surface of the crystalline silicon semiconductor substrate that is opposite the first surface; and
a second electrode part positioned on the second layer and connected to the second layer,
wherein a distance between the plurality of microwire structures is determined by Equation 2, and
a diameter of the microwire structures is determined by Equations 3 to 5:
wherein Equation 1 is $$\rho = E \times T_s / \sigma$$

where $\rho$ is the radius of curvature, E is an elastic modulus, $T_s$ is a thickness of the crystalline silicon semiconductor substrate divided by 2, and $\sigma$ is a tensile strength of the crystalline silicon semiconductor substrate material,
wherein Equation 2 is $$S > 2 \times t$$

where S is the distance between two of the microwire structures and t is a distance of stress measured at a surface of the crystalline silicon semiconductor substrate where the microwire structures meet the crystalline silicon semiconductor substrate during bending of the crystalline silicon semiconductor substrate,
wherein Equation 3 is $$D_{wire} > 2(T_1 + T_2)$$

where $D_{wire}$ is a diameter of microwire, $T_1$ is a thickness of the first layer, and $T_2$ is a thickness of a depletion layer,
wherein Equation 4 is $$w = \sqrt{\frac{2\varepsilon}{q} v_0 \left( \frac{1}{N_A} + \frac{1}{N_D} \right)}$$

where w is the thickness of a depletion layer, $\varepsilon$ is a dielectric constant of crystalline silicon, q is an electric charge (coulomb), $v_O$ is a built-in-voltage, $N_A$ is a density of the first layer, and $N_D$ is a density of the crystalline silicon semiconductor substrate, and
wherein Equation 5 is $$v_0 = \frac{KT}{q} \ln\left(\frac{N_A N_D}{N_i}\right)$$

where $v_O$ is the built-in-voltage, K is Boltzmann's constant (eV/K), T is an absolute temperature (K), q is the electric charge (coulomb), $N_A$ is the density of the first layer, $N_D$ is the density of the crystalline silicon semiconductor substrate, and $N_i$ is a density of an intrinsic silicon substrate.

2. The solar cell of claim 1, wherein the thickness of the crystalline silicon semiconductor substrate is less than 150 µm.

3. The solar cell of claim 1, wherein the thickness of the crystalline silicon semiconductor substrate is 50 µm or less.

4. The solar cell of claim 1, wherein the radius of curvature of the crystalline silicon semiconductor substrate is 15 mm or less.

5. The solar cell of claim 1, wherein the crystalline silicon semiconductor substrate has a first conductivity type,
the first layer is an emitter layer doped with an impurity having a second conductivity type opposite to the first conductivity type, and
the second layer is a back surface field layer doped with an impurity having the first conductivity type.

6. The solar cell of claim 1, wherein the microwire structures have a cylindrical shape or a tapered shape.

7. The solar cell of claim 1, wherein the plurality of microwire structures are arranged in a grid pattern.

8. The solar cell of claim 1, wherein the thickness of the first layer is 300 nm to 400 nm.

9. The solar cell of claim 1, further comprising a passivation layer on the first layer and the second layer.

10. The solar cell of claim 9, wherein the passivation layer comprises silicon nitride, silicon oxide, $TiO_2$, $Al_2O_3$, or a combination thereof.

11. The solar cell of claim 1, wherein the distance between the microwire structures is 1 µm or more.

12. The solar cell of claim 1, wherein the distance between the microwire structures is 2 µm or more.

13. A method of manufacturing a solar cell, the method comprising:
(a) forming a plurality of microwire structures on a crystalline silicon semiconductor substrate having a minimum radius of curvature calculated by Equation 1;
(b) forming a first layer and a second layer on a first surface and a second surface of the crystalline silicon semiconductor substrate, respectively;
(c) forming a first electrode part positioned on the first layer and connected with the first layer; and
(d) forming a second electrode part positioned on the second layer and connected with the second layer,
wherein
a distance between the plurality of microwire structures is determined by Equation 2, and
a diameter of the microwire structures is determined by Equations 3 to 5:
wherein Equation 1 is $$\rho = E \times T_s / \sigma$$

where $\rho$ is the radius of curvature, E is an elastic modulus, $T_s$ is a thickness of the crystalline silicon semiconductor substrate divided by 2, and $\sigma$ is a tensile strength of the crystalline silicon semiconductor substrate material,
wherein Equation 2 is $$S > 2 \times t$$

where S is the distance between two of the microwire structures and t is a distance of stress measured at a surface of the crystalline silicon semiconductor substrate where the microwire structures meet the crystalline silicon semiconductor substrate during bending of the crystalline silicon semiconductor substrate,
wherein Equation 3 is $$D_{wire} > 2(T_1 + T_2)$$

where $D_{wire}$ is a diameter of microwire, $T_1$ is a thickness of the first layer, and $T_2$ is a thickness of a depletion layer,
wherein Equation 4 is $$w = \sqrt{\frac{2\varepsilon}{q} v_0 \left( \frac{1}{N_A} + \frac{1}{N_D} \right)}$$

where w is the thickness of a depletion layer, $\varepsilon$ is a dielectric constant of crystalline silicon, q is an electric charge (coulomb), $v_O$ is a built-in-voltage, $N_A$ is a density of the first layer and $N_D$ is a density of the crystalline silicon semiconductor substrate, and
wherein Equation 5 is $$v_0 = \frac{KT}{q} \ln\left(\frac{N_A N_D}{N_i}\right)$$

where $v_O$ is the built-in-voltage, K is Boltzmann's constant (eV/K), T is an absolute temperature (K), q is the electric charge (coulomb), $N_A$ is the density of the first layer, $N_D$ is the density of the crystalline silicon semiconductor substrate, and $N_i$ is a density of an intrinsic silicon substrate.

14. The method of manufacturing a solar cell of claim 13, wherein the thickness of the crystalline silicon semiconductor substrate is less than 150 μm.

15. The method of manufacturing a solar cell of claim 13, wherein the forming of the microwire structures comprises etching the crystalline silicon semiconductor substrate.

16. The method of manufacturing a solar cell of claim 13, wherein the crystalline silicon semiconductor substrate has a first conductivity type,
the first layer is formed by doping the crystalline silicon semiconductor substrate with an impurity having a second conductivity type opposite to the first conductivity type, and
the second layer is formed by doping the crystalline silicon semiconductor substrate with an impurity having the first conductivity type.

17. The method of manufacturing a solar cell of claim 13, wherein the crystalline silicon semiconductor substrate and the first layer form a P-N junction.

18. The method of manufacturing a solar cell of claim 13, further comprising, after (b), forming a passivation layer on the first layer, on the second layer, or on the first layer and the second layer.

19. The method of manufacturing a solar cell of claim 13, further comprising, after (a), forming microwires having a tapered shape by selectively etching the microwire structures formed on the crystalline silicon semiconductor substrate.

20. The method of manufacturing a solar cell of claim 13, wherein the crystalline silicon semiconductor substrate is an n-type semiconductor substrate, and
the first layer is formed by doping the crystalline silicon semiconductor substrate with a hole-transporting material.

* * * * *